(12) United States Patent
Buijsse et al.

(10) Patent No.: US 9,583,303 B2
(45) Date of Patent: Feb. 28, 2017

(54) ALIGNING A FEATURELESS THIN FILM IN A TEM

(71) Applicant: FEI Company, Hillsboro, OR (US)

(72) Inventors: Bart Buijsse, Eindhoven (NL); Gijs van Duinen, Utrecht (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/878,513

(22) Filed: Oct. 8, 2015

(65) Prior Publication Data

US 2016/0104596 A1   Apr. 14, 2016

(30) Foreign Application Priority Data

Oct. 8, 2014  (EP) ................................. 14188029

(51) Int. Cl.
*H01J 37/26* (2006.01)
*H01J 37/02* (2006.01)
*H01J 37/153* (2006.01)

(52) U.S. Cl.
CPC .......... *H01J 37/023* (2013.01); *H01J 37/153* (2013.01); *H01J 37/261* (2013.01); *H01J 2237/024* (2013.01); *H01J 2237/1532* (2013.01); *H01J 2237/1534* (2013.01); *H01J 2237/2602* (2013.01)

(58) Field of Classification Search
USPC .......................... 250/306, 307, 309, 310, 311
See application file for complete search history.

(56) References Cited

U.S. PATENT DOCUMENTS

| 6,051,834 A * | 4/2000 | Kakibayashi ........... H01J 37/28 250/311 |
| 2008/0099677 A1 * | 5/2008 | Yoshida ................ H01J 37/263 250/311 |

(Continued)

FOREIGN PATENT DOCUMENTS

EP   2797101   10/2014

OTHER PUBLICATIONS

"FEI TECNAI G2 F30 TWiN TEM Training Manual", Electron Microscopy Core Facility, University of Missouri, Jun. 2013, 40 pages.

(Continued)

*Primary Examiner* — Nicole Ippolito
(74) *Attorney, Agent, or Firm* — Scheinberg & Associates, P.C.; Michael O. Scheinberg

(57) ABSTRACT

When preparing a Hole-Free Phase Plates (HFPP) a preferably featureless thin film should be placed with high accuracy in the diffraction plane of the TEM, or a plane conjugate to it. Two methods for accurately placing the thin film in said plane are described. One method uses a Ronchigram of the thin film while the TEM is in imaging mode, and the magnification of the Ronchigram is tuned so that the magnification in the middle of the Ronchigram is infinite. The second method uses electrons scattered by the thin film while the TEM is in diffraction mode. When the thin film does not coincide with the diffraction plane, electrons scattered by the thin film seem to originate from another location than the cross-over of the zero beam. This is observed as a halo. The absence of the halo is proof that the thin film coincides with the diffraction plane.

20 Claims, 4 Drawing Sheets

(56) References Cited

U.S. PATENT DOCUMENTS

2011/0133084 A1* 6/2011 Nagaoki ............... H01J 37/26
                                                    250/311
2011/0174971 A1 7/2011 Malac et al.

OTHER PUBLICATIONS

H.M. Johnson, "Chapter 4: In-Focus Phase Contrast Electron Microscopy", Principles and Techniques of Electron Microscopy, vol. 3: Biological Applications, Ed. M.A, Hayat, 1973; 45 pages.
Marek Malac et al., "Convenient Contrast Enhancement by a Hole-Free Phase Plate", Ultramicroscopy, vol, 118, Feb. 19, 2012, 13 pages.
Michael Marko et al., "Retrofit Implementation of Zernike Phase Plate Imaging for Cryo-TEM", Journal of Biology, vol. 174, Jan. 19, 2011, 13 pages.
Kuniaki Nagayama et al., "Phase Contrast Enhancement with Phase Rates in Biological Electron Microscopy", Microscopy Today, vol. 18, No. 4, Jul. 2010, 4 pages.
A.G. Ramirez et al., "Crystallization of Amorphous Carbon Thin Films in the Presence of Magnetic Media", Journal of Applied Physics, vol. 85, No, 3, Feb. 1, 1999, 6 pages.
J.M. Rodenburg et al., "Optimising the Resolution of TEM/STEM with the Electron on Ronchigram", Microscopy and Analysis, Jul. 1, 2002, 3 pages.
S.W. Van Der Hoeven et al "Alignment Control of STEM: a Ronchigram Based Appoach", Microscopy and Microanalysis, vol. 15, No. 2, Jul. 1, 2009, 2 pages.

* cited by examiner

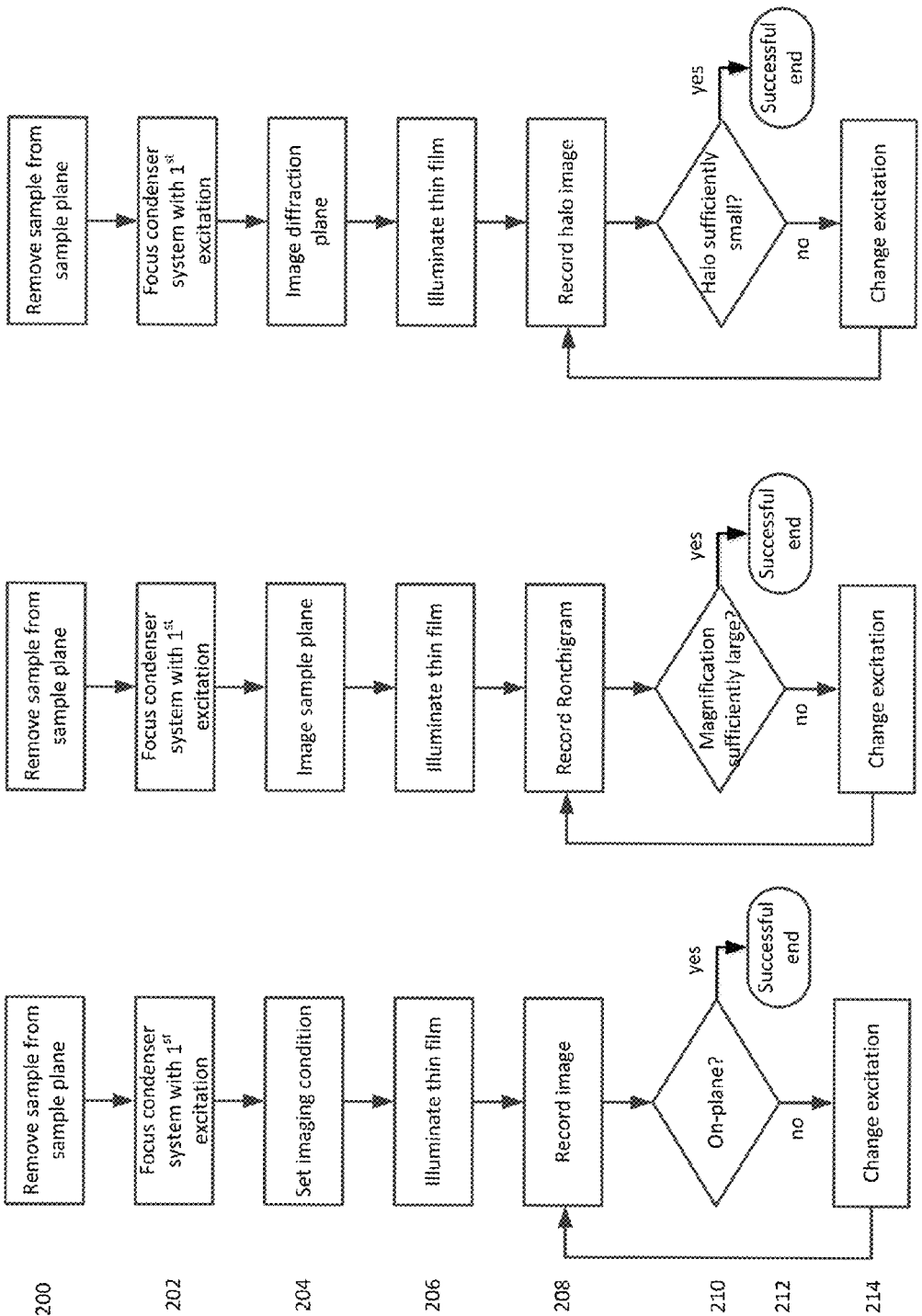

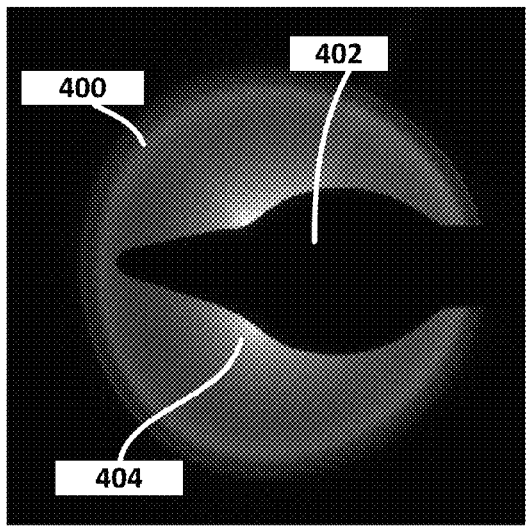
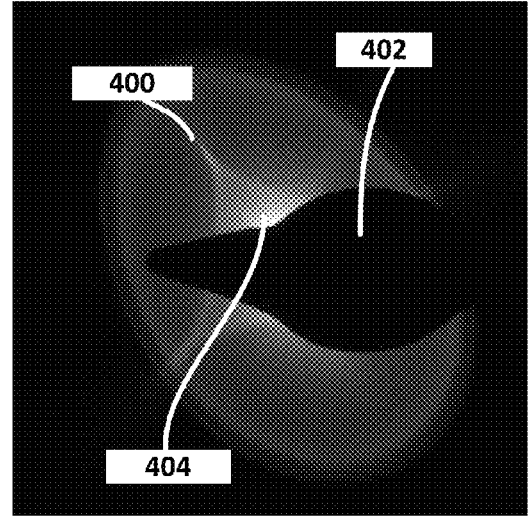
FIG. 4a          FIG. 4b
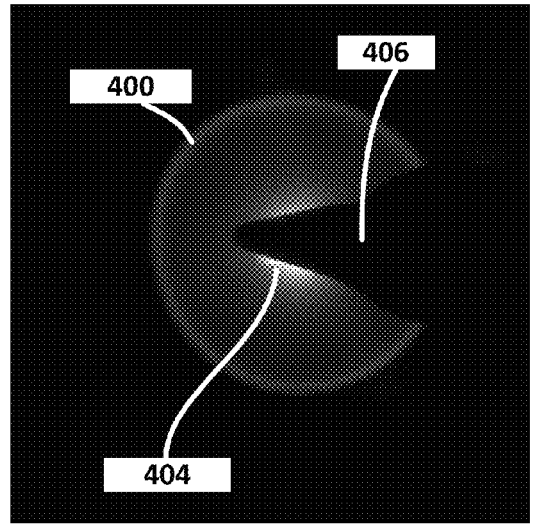
FIG. 4c

ALIGNING A FEATURELESS THIN FILM IN A TEM

FIELD OF THE INVENTION

The invention relates to a method of aligning a thin film in a Transmission Electron Microscope (TEM), the TEM comprising:
- an electron source for producing a beam of electrons,
- a condenser system for forming a parallel or almost parallel beam of electrons on a sample plane,
- an objective lens for focusing the parallel or almost parallel beam on the diffraction plane,
- a thin film positioned in or close to the diffraction plane or a plane conjugated thereto,
- an imaging system for forming an enlarged image of the sample plane or the diffraction plane onto an image plane,
- a detector for recording images formed on the image plane

BACKGROUND OF THE INVENTION

In a TEM a sample is imaged by passing a beam of energetic electrons with a selectable energy of, for example, between 40 keV and 400 keV, through the sample.

For so-called weak-phase samples, such as biological samples, most electrons pass through the sample while some electrons are elastically or inelastically scattered, the elastically scattered electrons forming diffracted beams. The image is formed by interference of the elastically scattered and unscattered electrons (diffracted and undiffracted beams).

A problem arises in that the Contrast Transfer Function (CTF) for low spatial frequencies in the image is zero or close to zero, resulting in low visibility of large objects/structures.

This is caused by the fact that phase variations induced by the specimen do not lead to intensity variations at the image plane for an in-focus aberration free imaging system. It is noted that, as known to the skilled person, for higher spatial frequencies, lens aberrations can turn phase variations into intensity variations.

A solution to the lack of contrast is the use of a phase plate, the phase plate introducing a phase difference between the diffracted beams and the undiffracted beam. There are two main types of phase plates: the so-called Zernike phase plate leaves the undiffracted beam unchanged, and causes a phase shift of the diffracted beams, while the so-called Boersch phase plate shifts the undiffracted beam while leaving the diffracted beams unchanged.

When the phase shift introduced by the phase plate is approximately $\pi/2$ or $-\pi/2$ the sine-like behavior of the CTF changes to a cosine-like behavior, and thus a maximum contrast (positive or negative) occurs for low spatial frequencies. For a more thorough description of phase plates and other contrast enhancing devices see Nagayama K et al., 'Phase Contrast Enhancement with Phase Plates in Biological Electron Microscopy', Microscopy Today, July 2010, Vol. 18, No. 4 (July 2010), pages 10-13, further referred to as Nagayama [-1-].

A problem of both Boersch phase plates and Zernike phase plates is that they require microscopic holes (typically less than 1 µm) for passing the undiffracted beam unhindered and a centering accuracy which is even an order of magnitude better than the hole size. This resulted in the development of self-centering phase plates, the so-called hole-free phase plates (HFPP).

A hole-free thin-film phase plate, further referred to as a HFPP, is first described by Johnson H M, 'Chapter 4: In-focus phase contrast electron microscopy', in 'Principles and Techniques of Electron Microscopy, Vol. 3: Biological applications', Ed. M. A. Hayat, ISBN-0-442-25674-4, pages 174-176, further referred to as Johnson [-2-].

The phase plate described in Johnson [-2-] is formed by a contamination spot on a continuous carbon film. This spot is formed using the electron beam in high current mode. The contamination spot modifies the thickness of the film, resulting in a thicker part. This film can then, at lower current, be used as a HFPP, where the undiffracted electrons, passing through the thick spot, experience a larger (negative) phase shift than the diffracted electrons passing through the non-contaminated (or less-contaminated) film. The effect of such a HFPP thus resembles the effect of Zernike phase plate, but with the difference that this phase plate gives a negative phase contrast.

Another HFPP is known from Malac M et al., 'Convenient contrast enhancement by a hole-free phase plate', Ultramicroscpy 118 (2012), p. 77-89, further referred to as Malac [-3-], describing a thin film of carbon or gold exposed to an electron beam, resulting in positive charging (due to secondary electron emission).

Yet another type of HFPP is known from European patent application No. EP14165529A1 to Buijsse et al., further referred to as Buijsse. This application describes a so-called Volta phase plate where the electronic structure of the thin film is changed by irradiation with a focused beam of electrons, resulting in the local build-up of a vacuum potential.

Such a HFPP is preferably formed from a featureless thin film, so that—when using the HFPP—the HFPP does not introduce artifacts. A problem arises in that, when forming such a self-centering HFPP, the thin film should be located with high precision in the diffraction plane or a plane conjugated thereto: the position of the thin film should coincide with the diffraction plane or a plane conjugated thereto (the so-called on-plane condition) and should not be spatially removed therefrom (a so-called off-plane condition).

Malac [-3-] is not specific how a featureless thin film is aligned with respect to the diffraction plane. Malac [-3-] suffices by mentioning the need to have a cross-over of size smaller than 1 um at the plane of the HFPP (page 80, right column, last paragraph). Also Buijsse is silent about this aspect.

There is a need for a method to accurately align a thin film with respect to the diffraction plane of the microscope. In particular, there is a need to determine and set the on-plane condition using a thin film formed from an amorphous thin film without contamination or markers. Most particular there is a need to determine on-plane condition of a featureless thin film before forming a HFPP of the thin film.

It is an object of the invention to address these issues. More specifically, it is an object of the invention to provide an automated method of conditioning a thin film to form a HFPP.

SUMMARY OF THE INVENTION

These and other objects are achieved by the method as set forth in the opening paragraph, the thin film being a featureless thin film, and the method further comprising:

focusing the condenser system with a first excitation associated with a first position of the diffraction plane,
illuminating the thin film with the focused beam of electrons,
repeatedly
recording an image,
from said recorded image derive whether the illumination is an on-plane illumination or an off-plane illumination, the on-plane illumination occurring when the thin film is located in the diffraction plane or a plane conjugated thereto and the off-plane illumination occurring when the thin film is located in a plane that does not coincide with the diffraction plane or a plane conjugated thereto,
changing the excitation of the condenser system to change the position of the diffraction plane or changing the position of the thin film along the optical axis,
until the illumination is an on-plane illumination.

Essential to the method according to the invention is that the method does not rely on thin film features (and the search for these features), which is attractive from an automation point of view; any position of the phase plate can be used. By visualizing the effect of the thin film on the beam it can be observed whether the thin film is illuminated in an on-plane condition or an off-plane condition. The observation whether this is the case can be achieved in two embodiments.

It is noted that the objective lens has a small effect on the position of the diffraction plane as well. As far as this effect is relevant, this effect is thought to be a part of the condenser system.

It is further noted that other methods are known for thin film phase plates showing features, such as Zernike phase plates showing a central holes or phase plates showing markers. See for example Marko M et al., 'Retrofit implementation of Zernike phase plate imaging for cryo-TEM', Journal of Structural Biology, Vol. 174, (2011), p.400-412, more specifically paragraph 2.4: TEM alignment. Here the central hole of a phase plate is imaged at low magnification and the illumination is then changed until the hole fills the field of view (magnification towards infinity).

First Embodiment

In this embodiment the sample plane is imaged (even though there is no sample inserted) and a Ronchigram is formed from the thin film, visualizing the contrast modulations due to interaction of the focused beam with the thin film. The invention is based on the insight that even a featureless thin film shows some contrast when imaged. This is shown in, for example, Ramirez A G et al., 'Crystallization of amorphous carbon thin films in the presence of magnetic media', Journal of Applied Physics, Vol 85, No 3 (Feb. 1, 1999) p. 1508-1513, more specifically FIG. 1, further referred to as Ramirez[-5-]

The on-plane condition (on-plane illumination) is realized when the central part of the Ronchigram, where aberrations from the focusing lens can be neglected, corresponds with infinite magnification.

Asymmetries in magnification indicate astigmatism in the condenser system, which can be corrected for.

It is noted that Ronchigrams are well known to the person skilled in the art, see e.g. Rodenburg J, 'The Ronchigram', http://www.rodenburg.org./stem/t200.html. What is called the "ring of infinite radial magnification" by Rodenburg should thus be brought in the center of the image by focusing or displacement of the thin film.

It is further noted that the contrast formed in the Ronchigram need not be introduced by thickness variations of the thin film, but may equally well be introduced by voltage variations, for example leading to deflection fields within or just outside the featureless thin film.

Second Embodiment

In this embodiment the diffraction plane is imaged and the projection system of the microscope is tuned such that a weak halo that surrounds the zero-beam, after having passed the thin-film, is observed. As there is no sample, the zero beam comprises all electrons that are normally irradiating a sample. The halo is caused by electrons scattered by the thin film. If the thin film is illuminated on-plane, both the focus of the zero beam formed at the diffraction plane and the origin of the electrons scattered by the thin film coincide. Both are thus imaged at the same position on the image plane. The moment of halo disappearance in combination with the formation of a focused spot can thus be used to set the on-plane condition with high precision.

Asymmetries in the halo point at astigmatism, both beam astigmatism and astigmatism of the projector system, which can be corrected for. More specifically the halo can be sharpened by using stigmators between the electron source and the plane where the thin film resides, while stigmators between the thin film and the image plane change the shape of the halo.

It is noted that this effect of halo formation is known when imaging the sample, see FEI TECNAI G2 F30 TWIN TEM Training Manual, Electron Microscopy Core Facility, University of Missouri, June 2013, http://www.emc.missouri.edu/pdf/F30%20Lab%20Manual%20v1.pdf, more specifically page 6: "Condense beam on the area of interest. If the area of interest is not at the eucentric height, there will be a halo around the bright spot on phosphorus screen.", but previously not for imaging of the diffraction plane.

Remarks

Both embodiments are best executed without a sample or sample area that may scatter the beam. The skilled artisan will recognize that parts of a sample with holes in it, such as holey carbon or Quantifoil® show areas where the beam pass unhindered.

It is noted that the intensity variation in the Ronchigram (embodiment 1) are weak and difficult to observe by eye on a fluorescent screen. It is desirable to use a sensitive imaging camera capable of high contrast. The halo method (embodiment 2) has a higher contrast and can be observed easier, for example using a fluorescent screen.

To avoid formation of contamination the thin films in both embodiments may be heated to a temperature of, for example, 200° C. It is noted that the formation of self-assembling structures described by Johnson [-2-] and Malac [-3-] relies on contamination, and therefore Johnson [-2-] and Malac [-3-] do not heat the thin film when assembling/forming the HFPP, as such heating prevents contamination.

The before mentioned embodiments can be used prior to conditioning a thin film to form a self-assembled HFPP, such as described in European Patent Application No. EP14187878.

Preferably the thin film is an amorphous, featureless thin film. The thin film being illuminated by electrons demands that the thin layer is a conductive layer. It may be a film of, for example, carbon, gold, platinum. However, also thin nano-crystalline films comprising carbon, silicon, nitride, boron, etc. may be used, as well as thin crystalline films. Note that small crystals are not considered as 'features' as long as the crystals are small compared to the focused electron beam and the thickness of the film. It is noted that typically the thickness of the thin film used for forming a HFPP is in the order of tens of nanometers or even less than ten nanometers.

BRIEF DESCRIPTION OF THE DRAWINGS

The invention will now be elucidated in more detail on the basis of exemplary embodiments and the accompanying schematic drawings, in which:

FIGS. 2a, 2b and 2c schematically show flowcharts of the method,

FIGS. 4a, 4b and 4c show three micrographs showing a halo.

DETAILED DESCRIPTION OF THE DRAWINGS

Figure 1:
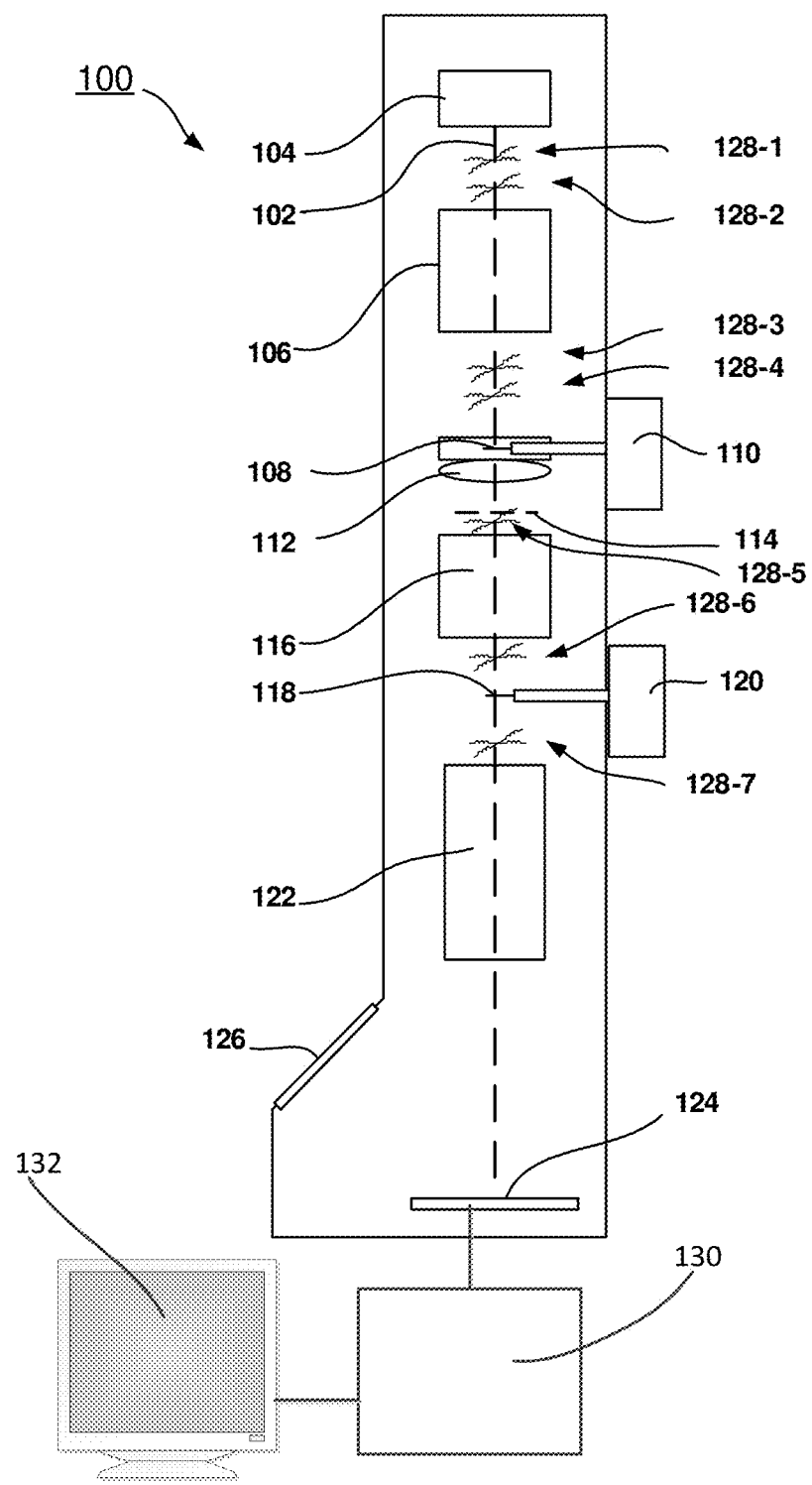
FIG. 1 schematically shows a TEM equipped with a phase plate.

FIG. 1 schematically shows a TEM 100 equipped with a HFPP.

FIG. 1 shows a particle source 104 producing a beam of particles, such as electrons, along optical axis 102. The particles have a selectable energy of typically between 80-300 keV, although higher energies, e.g. 400 keV-1 MeV, or lower energies, e.g. 50 keV, may be used. The beam of particles is manipulated by condenser system 106 to form a parallel beam impinging on a sample 108, the sample positioned with a sample holder 110. The sample holder can position the sample with respect to the optical axis and may shift the sample in the plane perpendicular to the optical axis and tilt the sample with respect to said axis. Objective lens 112 forms a magnified image of the sample. The objective lens is followed by a magnifying system 116, e.g. a doublet of lenses, forming an enlarged image of the back-focal plane 114 of the objective lens. A HFPP 118 is placed in the enlarged image of the back-focal plane of the objective lens, this conjugated plane positioned between the magnifying system and a projection system 122. The HFPP is positioned with a manipulator 120, allowing the HFPP to be centered round the optical axis. The projection system forms a magnified image of the sample on a detector 124, thereby revealing sample details of e.g. 0.1 nm. The detector may take the form of a fluorescent screen, or e.g. a CCD or CMOS camera. In the case of e.g. a fluorescent screen the screen can be viewed via the glass window 126. To align the optical components on the axis the TEM comprises a large number of deflectors, schematically shown as 128-1 . . . 128-7, although other deflectors on other places may be included.

A controller/data processor 130 is connected to, among others, the detector to record images. The controller may process data for displaying, but may also process the data to represent/determine the RAPS. The detector is in turn connected to a monitor (132), and can display on said monitor for example images as acquired from the detector, showing an enlarged image of the sample or an enlarged image of the diffraction plane, or it may image the RAPS.

It is noted that the HFPP may also be positioned in the back-focal plane itself, in which case the magnifying system 116 is superfluous.

The HFPP is normally formed as a thin film surrounded by a holder structure, for example a platinum aperture as commonly used in electron microscopy. Forming the phase plate with such an aperture has as an advantage that a standard aperture holder can be used to hold and position the HFPP. It is noted that heated aperture holders are known, the heating used to avoid contamination of the HFPP.

By now exposing the thin film to a large dose of energetic electrons, for example 200 keV electrons, a change in the electronic structure of the film surface or bulk material will occur, resulting in a difference in work function between irradiated area and non-irradiated area. As a result, an electrostatic potential will establish on the irradiated area, usually referred to as a Volta potential.

FIGS. 2a, 2b and 2c schematically show flowcharts of the method.

FIG. 2a schematically shows a flowchart encompassing both embodiment 1 and embodiment 2.

In step 200 any sample that may scatter the beam is removed from the sample plane. The skilled artisan will recognize that for samples with holes in it, such as holey carbon or Quantifoil® it is sufficient when an area is selected where the beam can pass unhindered.

In step 202 the condenser system is excited with a first excitation such that the diffraction plane is at an associated first position.

In step 204 the imaging conditions are set: depending on the embodiment the TEM is set in imaging mode (in which an enlarged image of the sample plane is formed on the image plane) or the TEM is set in diffraction mode (where an enlarged image of the diffraction plane is formed on the image plane). Also camera settings, beam current settings, etc. are selected in this step.

In step 206 the thin film is illuminated by the focused beam of electrons.

In step 208 an image is recorded. This image can be recorded on a fluorescent screen, optically coupled (via lenses or via fibers) to a camera system, or the image can be recorded on a direct electron detector (for example a CCD or a CMOS camera).

In step 210 it is determined whether the illumination is an on-plane illumination or an off-plane illumination.

In step 212 the illumination is an on-plane illumination (within preset limits) and the method ends successfully. The method can then be followed by conditioning of the thin film so as to form a HFPP, for example as described in European Patent Application No. EP14187878.

In step 214, where the illumination is an off-plane illumination, the excitation of the condenser system is changed. The method then loops back to step 208 for a re-iteration. It is assumed that the method always ends successfully. When the microscope is badly aligned, the thin film is badly damaged of the beam shows extreme aberrations, it is possible that no successful ending is reached. Such a condition can be detected by a large number of iterations or, for example, an oscillatory behavior of the excitation. In such cases the process can be aborted.

FIG. 2b schematically shows a flowchart for the Ronchigram embodiment.

FIG. 2b can be thought to be derived from FIG. 2a, but is explicit in that the TEM is used in imaging mode (step 204), and in that a Ronchigram is recorded in step 208. The decision on the illumination being an on-plane illumination is now based on the magnification of the Ronchigram It is noted that the Ronchigram will show information only when the thin film is very close to the diffraction plane. When now the magnification at the center of the Ronchigram is sufficiently large (for example: no structure within the Field-of-View), the thin film and the diffraction plane (or a plane conjugated thereto) coincide with high precision.

It is noted that instead of changing the excitation of the projection system (including the effect of the objective lens) also a mechanical movement of the thin film along the axis can be performed. Another possibility is to change the excitation of a lens placed between diffraction plane and image plane, thereby changing the position of the conjugated planes without changing the position of the diffraction plane.

FIG. 2c schematically shows a flowchart for the halo embodiment.

FIG. 2c can be thought to be derived from FIG. 2a, but is explicit in that the TEM is used in diffraction mode (step 204), and in that a halo is recorded in step 208. The decision on the illumination being an on-plane illumination is now based on the size of the halo:

when the halo is sufficiently small (below a preset value), the thin film and the diffraction plane (or a plane conjugated thereto) coincide with high precision.

Figure 3A:
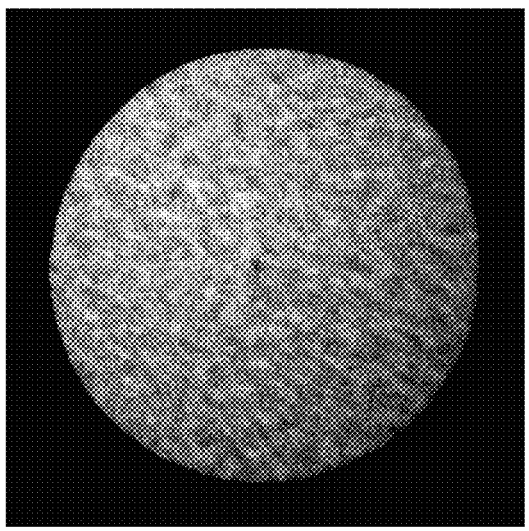
FIGS. 3a and 3b show two Ronchigrams.
Figure 3B:
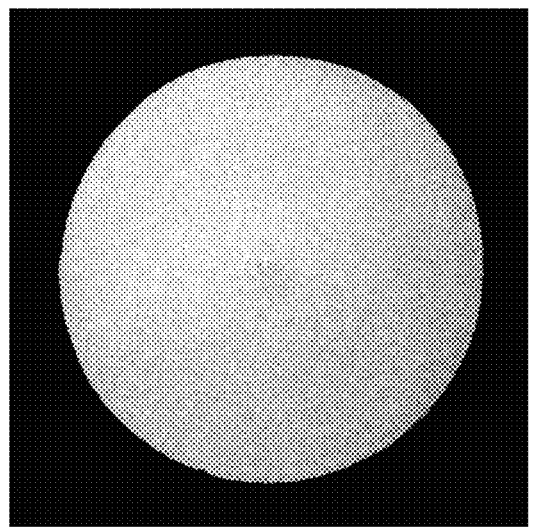

FIGS. 3a and 3b show two Ronchigrams

In a Ronchigram a focus is formed close to a plane of interest, and a projection image of said plane is formed. The closer the focus is to the plane of interest (here the thin film) the larger the magnification.

FIG. 3a shows a Ronchigram of an amorphous carbon film in an off-plane condition (off-plane illumination). Small intensity variations are visible.

FIG. 3b shows a Ronchigram of an amorphous carbon film in an on-plane condition (on-plane illumination). As the magnification is much larger than in FIG. 3a no structure is observed anymore over the field of view. Ideally the focus is now in the thin film.

FIGS. 4a, 4b and 4c show three micrographs showing a halo.

FIG. 4a shows (an image of) a focused central beam 404 that is intercepted by intercept needle 402. A halo 400 is shown surrounding the central beam.

The halo is formed by electrons scattered by the thin film. The scattered electrons are focused at another plane than the cross-over of the central beam, and thus a halo (a cross-section of the beam envelope of the scattered electrons) is visible in an off-plane condition. When the thin film coincides with the diffraction plane, and thus the focus of the central beam (also known as zero beam) is on the thin film, no halo is visible as origin of the scattered electrons and the origin of the cross-over are identical.

FIG. 4b can be thought to be derived from FIG. 4a, but inventors introduced some astigmatism and coma to the beam. This clearly warps the image. As known to the person skilled in the art a TEM is equipped with stigmators to correct such aberrations.

FIG. 4c can be thought to be derived from FIG. 4a, but shows the image at a higher magnification. The intercept needle 406 is the extremity of the intercept needle 402 shown in FIG. 4a. The halo is much smaller, indicating that the thin film and the diffraction plane are (sufficiently) close together.

Cited Non-Patent Literature

[-1-] Nagayama K et al., 'Phase Contrast Enhancement with Phase Plates in Biological Electron Microscopy', Microscopy Today, July 2010, Vol. 18, No. 4 (July 2010), pages 10-13.

[-2-] Johnson H M, 'Chapter 4: In-focus phase contrast electron microscopy', in 'Principles and Techniques of Electron Microscopy, Vol. 3: Biological applications', Ed. M. A. Hayat, ISBN-0-442-25674-4, pages 174-176.

[-3-] Malac M et al., 'Convenient contrast enhancement by a hole-free phase plate', Ultramicroscpy 118 (2012), p. 77-89

[-4-] Marko M et al., 'Retrofit implementation of Zernike phase plate imaging for cryo-TEM', Journal of Structural Biology, Vol. 174, (2011), p.400-412.

[-5-] Ramirez A G et al., 'Crystallization of amorphous carbon thin films in the presence of magnetic media', Journal of Applied Physics, Vol 85, No 3 (Feb. 1, 1999) p. 1508-1513.

[-6-] Rodenburg, J, 'The Ronchigram'; http.rodenburg.org/stem/t200.html

[-7-] FEI TECNAI G2 F30 TWIN TEM Training Manual, Electron Microscopy Core Facility, University of Missouri, June 2013, http://www.emc.missouri.edu/pdf/F30%20Lab%20Manual%20v1. pdf

The invention claimed is:

1. A method of aligning a thin film in a Transmission Electron Microscope, the Transmission Electron Microscope comprising:
   an electron source for producing a beam of electrons,
   a condenser system for forming a parallel or almost parallel beam of electrons on a sample plane,
   an objective lens for focusing the parallel or almost parallel beam on the diffraction plane,
   a thin film positioned in or close to the diffraction plane or a plane conjugated thereto, the thin film being a featureless thin film,
   an imaging system for forming an enlarged image of the sample plane or the diffraction plane onto an image plane,
   a detector for recording images formed on the image plane,
   the method comprising:
      focusing the condenser system with a first excitation associated with a first position of the diffraction plane,
      illuminating the thin film with the focused beam of electrons, repeatedly:
      recording an image,
      deriving from the recorded image whether the illumination is an on-plane illumination or an off-plane illumination, the on-plane illumination occurring when the thin film is located in the diffraction plane or a plane conjugated thereto and the off-plane illumination occurring when the thin film is located in a plane that does not coincide with the diffraction plane or a plane conjugated thereto, and
      changing the excitation of at least one lens to change the position of the diffraction plane or a plane conjugate thereto or changing the position of the thin film along the optical axis until the illumination is an on-plane illumination.

2. The method of claim 1 in which the image is an image of the sample plane and recording an image comprises recording a Ronchigram of the thin film and on-plane illumination is derived from the occurrence of infinite magnification in the center of the Ronchigram.

3. The method of claim 2 in which asymmetries of the magnification are used to detect beam astigmatism.

4. The method of claim 2 in which the thin film is heated to avoid contamination.

5. The method of claim 2 in which the method further comprises, before illuminating the thin film, removing from the sample plane any sample or sample area that may scatter the beam apparatus of claim 4, wherein the thin film is an amorphous or nano-crystalline, featureless thin film.

6. The method of claim 2 in which the featureless thin film is an amorphous or nano-crystalline, featureless thin film.

7. The method of claim 2 in which the thin film is a thin film comprising carbon, gold, platinum, and/or palladium.

8. The method of claim 2 in which the method further comprises conditioning the thin film to form a phase plate.

9. The method of claim 2 in which the changing of excitation of at least one lens comprises the changing of the excitation of the condenser system.

10. The method of claim 3 in which, when astigmatism is detected, said astigmatism is corrected before recording an image with a changed excitation of the condenser system or a changed position of the thin film.

11. The method of claim 1 in which the image is an image of the diffraction plane, in said image a halo surrounding the non-diffracted beam is observed, the halo caused by electrons scattered by the thin film, the presence of the halo indicating off-plane illumination and the absence of the halo indicating on-plane illumination.

12. The method of claim 11 in which asymmetries of the halo are used to detect astigmatism.

13. The method of claim 12, in which, when astigmatism is detected, said astigmatism is corrected before recording an image with a changed excitation of the condenser system or a changed position of the thin film.

14. The method of claim 1 in which the thin film is heated to avoid contamination.

15. The method of claim 1 in which the method further comprises, before illuminating the thin film, removing from the sample plane any sample or sample area that may scatter the beam.

16. The method of claim 1 in which the featureless thin film is an amorphous or nano-crystalline, featureless thin film.

17. The method of claim 1 in which the thin film is a thin film comprising carbon, gold, platinum, and/or palladium.

18. The method of claim 1 in which the method further comprises conditioning the thin film to form a phase plate.

19. The method of claim 1 in which the changing of excitation of at least one lens comprises the changing of the excitation of the condenser system.

20. The method of claim 1 in which the thin film is positioned in or close to a plane conjugated to the diffraction plane and the changing of excitation of at least one lens comprises the changing of excitation of a lens between the diffraction plane and the thin film.

* * * * *